(12) United States Patent
Su et al.

(10) Patent No.: US 6,590,261 B2
(45) Date of Patent: Jul. 8, 2003

(54) ELECTROSTATIC DISCHARGE PROTECTION STRUCTURE

(75) Inventors: Shin Su, Taipei (TW); Chun-Hsiang Lai, Taichung (TW); Meng-Huang Liu, Hsinchu (TW); Tao-Cheng Lu, Kaohsiung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/973,927

(22) Filed: Oct. 10, 2001

(65) Prior Publication Data

US 2003/0067039 A1 Apr. 10, 2003

(51) Int. Cl.[7] .................. H01L 23/62; H01L 29/00; H01L 29/74
(52) U.S. Cl. ............... 257/355; 257/107; 257/111; 257/173; 257/174; 257/356; 257/358; 257/363; 257/546; 257/547
(58) Field of Search ................ 257/355, 546, 257/547, 356, 107, 111, 173–174, 358, 363

(56) References Cited

U.S. PATENT DOCUMENTS

| | | | | | |
|---|---|---|---|---|---|
| 5,430,595 | A | * | 7/1995 | Wagner et al. | 361/56 |
| 5,465,189 | A | * | 11/1995 | Polgreen et al. | 361/58 |
| 5,528,188 | A | * | 6/1996 | Au et al. | 327/310 |
| 5,852,541 | A | * | 12/1998 | Lin et al. | 361/111 |
| 6,177,298 | B1 | * | 1/2001 | Quigley | 438/135 |
| 6,304,127 | B1 | * | 10/2001 | Lin | 327/321 |
| 6,320,230 | B1 | * | 11/2001 | Yu | 257/355 |
| 6,358,781 | B1 | * | 3/2002 | Lee et al. | 438/133 |
| 2001/0007521 | A1 | * | 7/2001 | Chen | 361/56 |
| 2002/0089017 | A1 | * | 7/2002 | Lai et al. | 257/355 |

* cited by examiner

Primary Examiner—Amir Zarabian
Assistant Examiner—Ida M. Soward

(57) ABSTRACT

An electrostatic discharge (ESD) protection structure is disclosed. The ESD protection structure of the present invention uses a resistance capacitance (RC) circuit to distinguish an overshoot phenomenon caused by the instantaneous power-on from an ESD event, so as to prevent the ESD protection device, such as a P-type modified lateral silicon controlled rectifier (MLSCR), from being triggered unexpectedly by an overshoot phenomenon which results from the power-on under normal operation, and thereby the efficiency of the ESD protection device is promoted.

9 Claims, 3 Drawing Sheets

ELECTROSTATIC DISCHARGE PROTECTION STRUCTURE

FIELD OF THE INVENTION

The present invention relates to an electrostatic discharge (ESD) protection structure, and more particularly, to an ESD protection structure having the modified lateral silicon controlled rectifiers (MLSCR) by using a resistance capacitance (RC) circuit to distinguish an ESD event from an overshoot phenomenon caused by an instantaneous power-on.

BACKGROUND OF THE INVENTION

While two nonconductors are either approaching or separating, a very possible result is electrons being transferred between these two nonconductors, with which excess charges called electrostatic charges being induced. When electrostatic charges accumulated on an object are discharged into the other object having relatively low voltage, a so-called ESD phenomenon is induced. Generally, the formation of ESD can be divided into a direct type and an indirect type, wherein the direct type means that an object directly contacts the other object on which charges are induced by friction, and the indirect type means that the object is charged by the induction resulting from the change of surrounding electricity.

However, while metal pins of an integrated circuit (IC) are in contact with an object having electrostatic charges, instantaneous high-voltage charges are generated and affect the inner circuit through the metal pins. It can be known from the above description that ESD is one of the major potential factors causing the failure of an electronic system. On the other hand, a metal oxide semiconductor (MOS) transistor with the characteristic of high impedance is easily to be damaged by the influence from ESD. As the complexity of semiconductor increases, the sensitivity of the sub-micron process and extremely narrow line-width to instantaneous over-voltage also has to be raised. A voltage of only about 15 volt (V) to about 20 V is all that is needed to damage the gate oxide layer of the MOS transistor, and the peak value of ESD pulse often reaches thousands of volts. Hence, for enhancing the reliability of an electronic device, an ESD protection device has to be installed into an electronic device to avoid the electronic device from being damaged by an ESD event.

Recently, the ESD protection device comprises a resistor, a diode, a MOS transistor having a thin oxide layer, a device having a thick oxide layer, a parasitic bipolar junction transistor (PBJT), a parasitic lateral silicon controlled rectifier, and a combination of the devices described above. The following description is the operating principle of an ESD protection circuit using the P-type MLSCR.

Referring to FIG. 1, a cross-sectional view of a conventional ESD protection structure having a P-type MLSCR is shown. On a P-type substrate 100, there are an N-well 102, an N-type diffusion 112, a P-type diffusion 114, and a P-type diffusion 110 formed, wherein the N-well 102 further comprises an N-type diffusion 106 and a P-type diffusion 108. The P-type diffusion 110 is located between the N-well 102, and the P-type substrate 100. The P-type diffusion 108 located in the N-well 102 is an anode of the P-type MLSCR 118, and the N-type diffusion 112 located in the P-type substrate 100 is a cathode of the P-type MLSCR 118.

P-type MLSCR 118 can be considered as two individual bipolar transistors, which are a PNP transistor composed of a P-type diffusion 108, an N-well 102 and a P-type diffusion 110, and an NPN transistor composed of a P-type diffusion 110, a P-type substrate 100 and an N-type diffusion 112.

FIG. 2 is a diagram showing the curve of operation current I vs. operation voltage V for a conventional ESD protection structure having a P-type MLSCR. With reference to this figure, the operating principle of the P-type MLSCR 118 used as protection device is as follows. P-type substrate 100 is connected to ground, a voltage is applied to the pad 104 of an IC. When the ESD event occurs, holes are injected into the N-well 102 from the P-type diffusion 108, so that a forward bias is induced to turn on the PNP transistor. Meanwhile, current flows through the PNP transistor into the P-type substrate 100, and thus the forward bias is applied to the NPN transistor to also turn on the NPN transistor. The induced electrons flow into the PNP transistor, and flow through the cathode to ground. Since a forward bias is applied to the PNP transistor with the electrons flowing through, a bias is no longer needed for the PNP transistor, and the voltage of the MLSCR is called a trigger voltage $V_T$. Then the applied voltage is decreased gradually to a minimum value, and the minimum value is called a holding voltage $V_H$.

According to the above description, when the voltage released from ESD is bigger than the trigger voltage of SCR, the charges released from ESD are guided away by the SCR to protect the device from damage caused by ESD. However, when the SCR is triggered accidentally, for example, by an overshoot phenomenon induced by turning on power suddenly, the duration of ESD is far less than that of turning on power, and the voltage $V_P$ is supplied uninterruptedly after power is turned on. Since the SCR misjudges a power-on event as an ESD event, the SCR increase the current I continuously to catch up with the applied voltage $V_P$, and eventually the SCR is burned out due to overheating, as shown in FIG. 3.

SUMMARY OF THE INVENTION

Since there is only a small difference between the voltage to be distinguished and the trigger voltage of the MLSCR in the aforementioned conventional ESD protection structure, for example, the voltage induced by an overshoot phenomenon caused by turning on power, the overshoot phenomenon and the electrostatic event are hardly distinguished from each other effectively by the ESD protection structure, so that the MLSCR is improperly triggered to cause the damage of the ESD protection structure.

One of the major objects of the present invention is to provide an ESD protection structure, and the present invention is to implement a RC circuit on the ESD protection structure having, for example, a P-type MLSCR. Time constant of the RC circuit is adjusted to the one between ESD pulse time and power-on time of normal operation, so as to distinguish an ESD event from an overshoot phenomenon caused by turning on power, and thereby to avoid the SCR being triggered improperly and the damage of the ESD protection device.

The further object of the present invention is to provide an ESD protection structure, and the present invention is to implement a RC circuit on the ESD protection structure having, for example, a P-type MLSCR. Time constant of the RC circuit is adjusted to the one between ESD pulse time and power-on time of normal operation, thereby forcing most of the SCR current to flow to a substrate and thus lowering a trigger voltage of the SCR, so that the damage due to an accidental triggering can be avoided and the efficiency of ESD protection device is promoted.

Based on the objects described above, the present invention is to provide an ESD protection structure mainly comprising a MLSCR, a MOS transistor, and a RC circuit, wherein the MLSCR comprises a P-type substrate, an N-well formed in the P-type substrate, a first N-type diffusion and a first P-type diffusion located in the N-well, a second P-type diffusion located between the N-well and the P-type substrate, and a second N-type diffusion and a third P-type diffusion located outside the N-well. Time constant of the RC circuit is set in the rank of $10^{-6}$ second ($\mu$s), and the first N-type diffusion and the first P-type diffusion are connected to a pad, and the second N-type diffusion and the third P-type diffusion are connected to ground. When an ESD event occurs, the pulse time of ESD is so short in the rank of $10^{-9}$ second (nanoseconds; ns) that the RC circuit cannot respond in time, which results in a near 0 V gate voltage of the MOS transistor connected to the RC circuit, and hence the MOS transistor stays in a closed state, thereby lowering the trigger voltage of MLSCR. However, while in normal operation, since normal power-on duration belongs to the rank of $10^{-3}$ second (milliseconds; ms), the voltage of normal power-on can be guided to the gate of MOS transistor by the RC circuit so as to turn on the MOS transistor, and hence part of the current flows through the second P-type diffusion into the MOS transistor and then to ground, and the trigger voltage of the MLSCR is further raised. According to the above description, with the application of ESD protection structure of the present invention, the trigger voltage of ESD event of the MLSCR can be lowered, and the trigger voltage of normal power-on of the MLSCR can be enhanced. With the different trigger events, the difference of trigger voltage between these two aforementioned situations is enlarged, and therefore the ESD event and the normal power-on event can be distinguished from each other effectively, so that the object of enhancing the efficiency of ESD protection device can be obtained.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The function of an ESD protection circuit is to provide an appropriate route for letting electrostatic charges pass through and to stay away from the circuit to be protected, before the ESD pulse damages the circuit to be protected after an EDS event occurs. Besides, an ESD protection circuit itself also has to own the capability for handling the energy carried by the ESD pulse, so that it is not damaged while leading the ESD pulse. Furthermore, ESD protection circuit must have a special design with which the circuit is not triggered unless an ESD event occurs, or the electrical stability of the device to be protected is likely to be affected, and even to damage the ESD protection circuit itself and decrease its efficiency. Therefore, in order to protect an ESD protection circuit from an abnormal startup, for example, an overshoot phenomenon from power-on, the present invention provides an ESD protection structure to distinguish an ESD event from an event of normal operation power-on.

Figure 1:
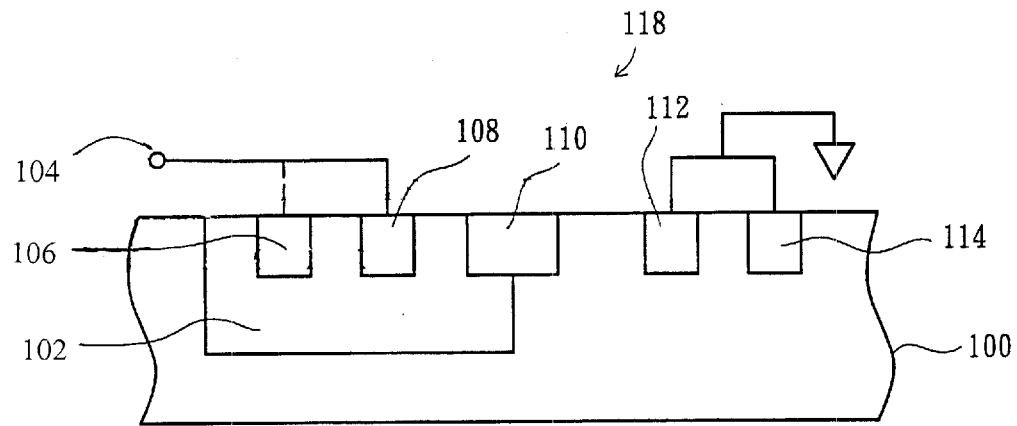
FIG. 1 is a cross-sectional view of a conventional ESD protection structure having a P-type MLSCR.
Figure 2:
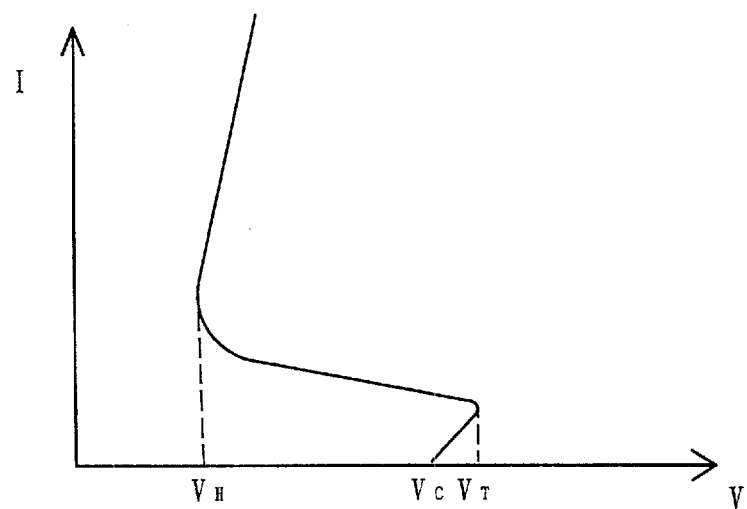
FIG. 2 is a curve diagram of operation current vs. operation voltage for a conventional ESD protection structure having a P-type MLSCR.
Figure 3:
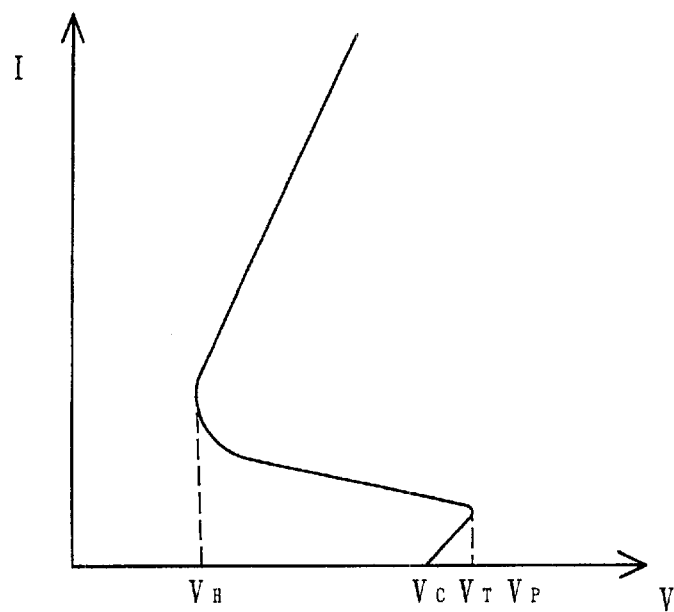
FIG. 3 is a curve diagram of operation current vs. operation voltage for a conventional ESD protection structure having a P-type MLSCR under improper triggering.
Figure 4:
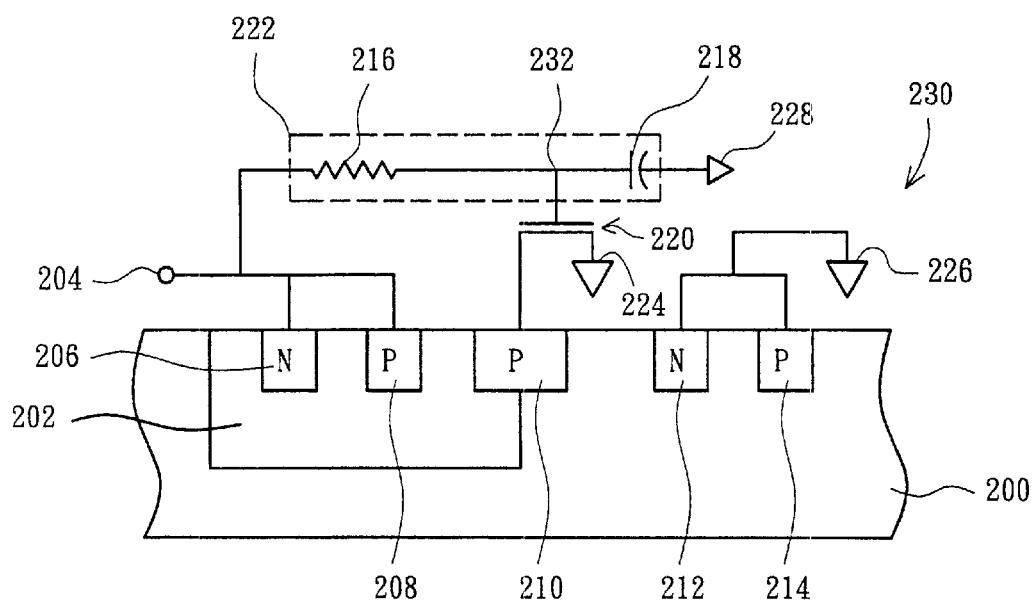
FIG. 4 is a cross-sectional view of an ESD protection structure having a P-type MLSCR in accordance with a preferred embodiment of the present invention.

Referring to FIG. 4, a cross-sectional view of an ESD protection structure having a P-type MLSCR in accordance with a preferred embodiment of the present invention is illustrated. The ESD protection structure mainly comprises a P-type MLSCR 230, a MOS transistor 220, and a RC circuit 222, wherein the P-type MLSCR 230 further comprises a P-type substrate 200, an N-well 202 formed in the P-type substrate 200, a first N-type diffusion 206 and a first P-type diffusion 208 located in the N-well 202, a second P-type diffusion 210 located between the N-well 202 and the P-type substrate 200, and a second N-type diffusion 212 and a third P-type diffusion 214 located outside the N-well 202.

The design of the present invention is to set the time constant of a RC circuit 222 in the rank of $10^{-6}$ second ($\mu$s), wherein the RC circuit 222 is composed of a resistor 216 and a capacitor 218, and one end of the resistor 216 is connected to a pad 204 of an IC and the other end of the resistor 216 is connected to a node 232, and one end of the capacitor 218 is connected to node 232 and the other end of the capacitor 218 is connected to a grounded node 228. In addition, the first N-type diffusion 206 and the first P-type diffusion 208 are electrically connected to the pad 204, and a gate of the MOS transistor 220 is electrically connected to the node 232 of the RC circuit 222, and a source of the MOS transistor 220 is connected to grounded node 224, and a drain of the MOS transistor 220 is electrically connected to the second P-type diffusion 210 of the P-type MLSCR 230, and the second N-type diffusion 212 and the third P-type diffusion 214 are connected to grounded node 226.

When an ESD event occurs, i.e., when an electrostatic stress comes into the ESD protection structure, the ESD pulse time belongs to the rank of nanoseconds, which is so fast that the RC circuit 222 fails to respond in time so as to cause a near 0 V gate voltage of the MOS transistor 220 electrically connected to the RC circuit 222. Hence, the MOS transistor 220 is in a closed state, and the trigger voltage of the P-type MLSCR 230 is decreased. On the other hand, when the ESD protection structure is under normal operation, since the operating duration of normal power-on is in the rank of milliseconds, the RC circuit 222 can guide the voltage of normal power-on to the gate of the MOS transistor 220 thereby turning on the MOS transistor 220, and let part of current flow through the second P-type diffusion 210 into the MOS transistor 220 and then to ground, and further results in the increase of the trigger voltage of the P-type MLSCR 230.

Figure 5:
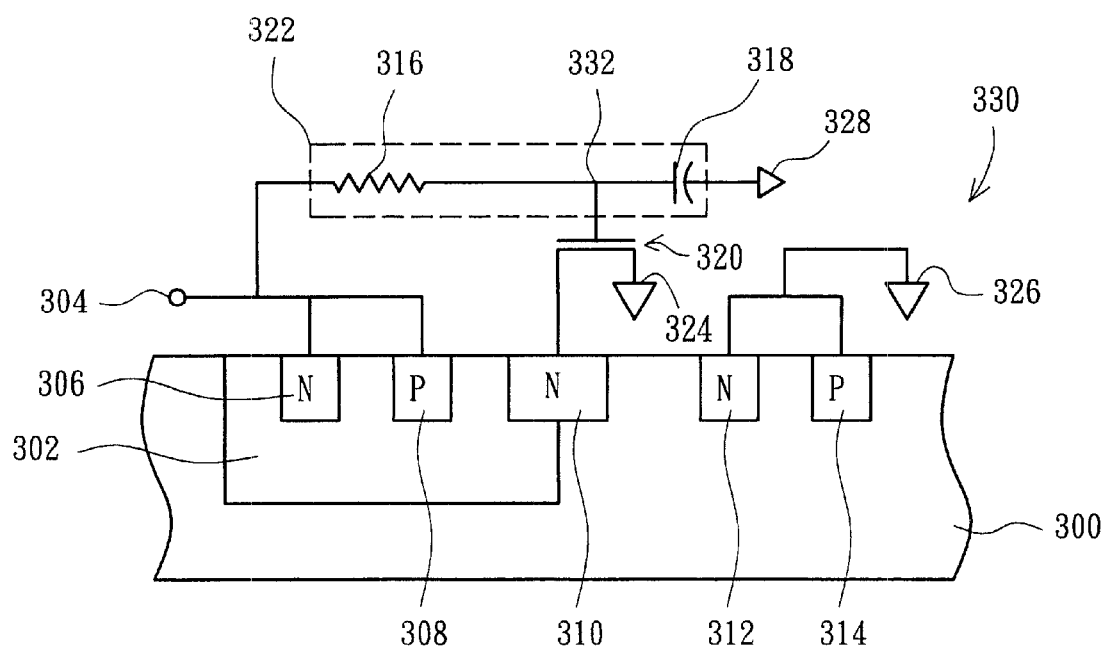
FIG. 5 is a cross-sectional view of an ESD protection structure having an N-type MLSCR in accordance with another preferred embodiment of the present invention.

Referring to FIG. 5, a cross-sectional view of an ESD protection structure having a N-type MLSCR in accordance with another preferred embodiment of the present invention is illustrated. In the same way, the ESD protection structure is electrically connected to a pad 304 of an IC, and comprises a MOS transistor 320 and a RC circuit 322 composed of a resistor 316 and a capacitor 318. However, The difference of the current embodiment is that the SCR described herein is an N-type MLSCR 330. The N-type MLSCR 330 comprises a P-type substrate 300, an N-well 302 formed in the P-type substrate 300, a first N-type diffusion 306 and a first P-type diffusion 308 located in the N-well 302, a second N-type diffusion 310 located between the N-well 302 and the P-type substrate 300, and a third N-type diffusion 312 and a second P-type diffusion 314 located outside the N-well 302. Hence, it is obvious that the N-type MLSCR 330 is formed by replacing the second P-type diffusion 210 of the P-type MLSCR 230 with a N-type semiconductor area, i.e., the second N-type diffusion 310, and can also be applied in the ESD protection structure of the present invention. The operation principle is described as follows.

Just as the design of the ESD protection structure having P-type MLSCR 230, a time constant of the RC circuit 322, composed of the resistor 316 and the capacitor 318, is set in the rank of $10^{-6}$ second ($\mu s$), wherein one end of the resistor 316 is electrically connected to the pad 304 of the IC, and the other end of the resistor 316 is electrically connected to a node 332, and one end of the capacitor 318 is electrically connected to the node 332, and the other end of the capacitor 318 is connected to a grounded node 328. Furthermore, the first N-type diffusion 306 and the first P-type diffusion 308 are electrically connected to the pad 304, and a gate of the MOS transistor 320 is electrically connected to the node 332 of the RC circuit 322, and a source of the MOS transistor 320 is connected to grounded node 324, and a drain of the MOS transistor 320 is electrically connected to the second N-type diffusion 310 of the N-type MLSCR 330, and the third N-type diffusion 312 and the second P-type diffusion 314 are connected to grounded node 326.

Similarly, when the ESD protection structure suffers an ESD event, the ESD pulse time is so short that the RC circuit 322 fails to respond to the ESD pulse and thus causes a near 0 V gate voltage of the MOS transistor 320 electrically connected to the node 332 of the RC circuit 322. Hence, the MOS transistor 320 is in a closed state, which results in a lower trigger voltage of the N-type MLSCR 330. On the other hand, with the ESD protection structure under normal operation, since the responding duration of normal power-on is in the rank of milliseconds, the voltage of normal power-on is guided to the gate of MOS transistor 320 by the RC circuit 322 so as to turn on the MOS transistor 320, and part of current flows through the second N-type diffusion 310 into the MOS transistor 320 and then to ground, so that the trigger voltage of the N-type MLSCR 330 is increased.

Based on the above description, under different trigger events, the trigger voltage of the MLSCR of the ESD protection structure of the present invention can be adjusted to enlarge the difference of the trigger voltages between these two situations described above. Therefore, the ESD event and the normal power-on event can be distinguished effectively, and the efficiency of the ESD protection can be promoted.

The advantage of the present invention is to provide an ESD protection structure using a MLSCR as an ESD protection device, wherein a RC circuit and a MOS transistor are installed to enlarge the difference of the trigger voltage between an ESD event and a normal power-on event, so that the ESD event and the normal power-on event can be distinguished effectively. The application of the present invention can prevent the ESD protection device from being triggered improperly by the overshoot from normal power-on and from being damaged by the improper trigger, so that the efficiency of the ESD protection device is promoted.

As is understood by a person skilled in the art, the foregoing preferred embodiments of the present invention are illustrations of the present invention rather than limitations of the present invention. They are intended to cover various modifications and similar arrangements included within the spirit and scope of the appended claims, the scope of which should be accorded the broadest interpretation so as to encompass all such modifications and similar structures.

What is claimed is:

1. An electrostatic discharge (ESD) protection structure comprising:
    a modified lateral silicon controlled rectifiers (MLSCR) connected to a pad of an IC;
    a metal oxide semiconductor (MOS) transistor, and a drain of the MOS transistor is connected to the MLSCR; and
    a resistance capacitance (RC) circuit comprising a resistor and a capacitor, wherein one end of the resistor of the RC circuit is connected to the pad, and the other end of the resistor is connected to one end of the capacitor and a gate of the MOS transistor, and the other end of the capacitor is connected to a first grounded node, and, while a power-on voltage of normal operation enters the ESD protection structure, the RC circuit guides the power-on voltage into the MOS transistor to turn on the MOS transistor, and guides a current of the MLSCR flowing through a source of the MOS transistor that is connected to a second grounded node into the second grounded node, thereby increasing a trigger voltage of the MLSCR under the normal operation so as to distinguish an ESD event from the normal operation.

2. The ESD protection structure according to claim 1, wherein the MLSCR is P-type.

3. The ESD protection structure according to claim 1, wherein the MLSCR is N-type.

4. The ESD protection structure according to claim 1, wherein a time constant of the RC circuit is in the rank of $10^{-6}$ second ($\mu s$).

5. An electrostatic discharge (ESD) protection structure comprising:
    a P-type modified lateral silicon controlled rectifiers (MLSCR), further comprising:
        a P-type substrate;
        a N-well formed in the P-type substrate;
        a first N-type diffusion formed in the N-well, wherein the first N-type diffusion is connected to a pad of an IC;
        a first P-type diffusion formed in the N-well, wherein the first P-type diffusion is connected to the pad;
        a second P-type diffusion formed between the P-type substrate and the N-well, wherein the second P-type diffusion is connected to a drain of a metal oxide semiconductor (MOS) transistor;
        a second N-type diffusion formed in the P-type substrate, wherein the second N-type diffusion is connected to a first potential node; and
        a third P-type diffusion formed in the P-type substrate, wherein the third P-type diffusion is connected to the first potential node; and
    a resistance capacitance (RC) circuit comprising a resistor and a capacitor, wherein one end of the resistor of the RC circuit is connected to the pad, and the other end of the resistor is connected to one end of the capacitor and a gate of the MOS transistor, and the other end of the capacitor is connected to a second potential node, and, while a power-on voltage of normal operation enters the ESD protection structure, the RC circuit guides the power-on voltage into the MOS transistor to turn on the MOS transistor, and guides a current of the P-type MLSCR flowing through the second P-type diffusion and a source of the MOS transistor that is connected to a third potential node into the third potential node, so as to increase a trigger voltage of the P-type MLSCR under the normal operation.

6. The ESD protection structure according to claim 5, wherein a time constant of the RC circuit is in the rank of $10^{-6}$ second ($\mu$s).

7. The ESD protection structure according to claim 5, wherein the first potential node, the second potential node, and the third potential node are grounded nodes.

8. An electrostatic discharge (ESD) protection structure comprising:
   a N-type modified lateral silicon controlled rectifiers (MLSCR), further comprising:
   a P-type substrate;
   a N-well formed in the P-type substrate;
   a first N-type diffusion formed in the N-well, wherein the first N-type diffusion is connected to a pad of an IC;
   a first P-type diffusion formed in the N-well, wherein the first P-type diffusion is connected to the pad;
   a second N-type diffusion formed between the P-type substrate and the N-well, wherein the second N-type diffusion is connected to a drain of a metal oxide semiconductor (MOS) transistor;
   a third N-type diffusion formed in the P-type substrate, wherein the third N-type diffusion is connected to a first grounded node; and
   a second P-type diffusion formed in the P-type substrate, wherein the second P-type diffusion is connected to the first grounded node, and
   a resistance capacitance (RC) circuit comprising a resistor and a capacitor, wherein one end of the resistor of the RC circuit is connected to the pad, and the other end of the resistor is connected to one end of the capacitor and a gate of the MOS transistor, and the other end of the capacitor connected to a second grounded node, and, while a power-on voltage of normal operation enters the ESD protection structure, the RC circuit guides the power-on voltage into the MOS transistor to turn on the MOS transistor, and guides a current of the N-type MLSCR flowing through the second N-type diffusion and a source of the MOS transistor that is connected to a third grounded node into the third grounded node, so as to increase a trigger voltage of the N-type MLSCR under the normal operation.

9. The ESD protection structure according to claim 8, wherein a time constant of the RC circuit is in the rank of $10^{-6}$ second ($\mu$s).

* * * * *